US010573383B2

(12) United States Patent
Dallabora et al.

(10) Patent No.: US 10,573,383 B2
(45) Date of Patent: *Feb. 25, 2020

(54) DATA STATE SYNCHRONIZATION

(71) Applicant: Micron Technology, Inc., Boise, ID (US)

(72) Inventors: Marco Dallabora, Melegnano (IT); Paolo Amato, Treviglio (IT); Daniele Balluchi, Cernusco sul Naviglio (IT); Danilo Caraccio, Buonalbergo (IT); Emanuele Confalonieri, Lesmo (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/124,222

(22) Filed: Sep. 7, 2018

(65) Prior Publication Data

US 2019/0035461 A1  Jan. 31, 2019

Related U.S. Application Data

(63) Continuation of application No. 15/664,014, filed on Jul. 31, 2017, now Pat. No. 10,083,751.

(51) Int. Cl.
*G11C 11/00* (2006.01)
*G11C 13/00* (2006.01)

(52) U.S. Cl.
CPC ........ *G11C 13/0069* (2013.01); *G11C 13/003* (2013.01); *G11C 13/004* (2013.01);
(Continued)

(58) Field of Classification Search
CPC .............. G11C 13/0004; G11C 13/004; G11C 13/0069; G11C 13/0023; G11C 13/0038;
(Continued)

(56) References Cited

U.S. PATENT DOCUMENTS 7,010,643 B2   3/2006   Roohparvar
7,778,079 B2   8/2010   Jeong et al.
(Continued)

FOREIGN PATENT DOCUMENTS

TW           552556 B       9/2003

OTHER PUBLICATIONS

International Search Report and Written Opinion from related international application No. PCT/US2018/043368, dated Oct. 26, 2018, 10 pp.
(Continued)

*Primary Examiner* — Thong Q Le
(74) *Attorney, Agent, or Firm* — Brooks, Cameron & Huebsch, PLLC

(57) ABSTRACT

The present disclosure includes apparatuses, and methods for data state synchronization. An example apparatus includes performing a write operation to store a data pattern in a group of resistance variable memory cells corresponding to a selected managed unit having a first status, updating a status of the selected managed unit from the first status to a second status responsive to performing the write operation, and providing data state synchronization for a subsequent write operation performed on the group by placing all of the variable resistance memory cells of the group in a same state prior to performing the subsequent write operation to store another data pattern in the group of resistance variable memory cells.

20 Claims, 5 Drawing Sheets

(52) U.S. Cl.
CPC ...... *G11C 13/0004* (2013.01); *G11C 13/0038* (2013.01); *G11C 13/0097* (2013.01); *G11C 2013/0088* (2013.01)

(58) Field of Classification Search
CPC ........ G11C 2013/0054; G11C 2213/72; G11C 13/003; G11C 13/0035; G11C 13/0097; G11C 2013/0088; G11C 11/1673; G11C 11/56; G11C 11/5678; G11C 13/0026; G11C 13/0064; G11C 2013/0076; G11C 2013/0078; G11C 2213/71; G11C 2213/73
USPC ......... 365/148, 163, 210.1, 211, 230.03, 175
See application file for complete search history.

(56) References Cited

U.S. PATENT DOCUMENTS

| | | | |
|---|---|---|---|
| 8,356,153 | B2 | 1/2013 | Franceschini et al. |
| 8,467,237 | B2 | 6/2013 | Bedeschi et al. |
| 8,649,212 | B2 | 2/2014 | Kau et al. |
| 9,472,274 | B1 | 10/2016 | Hsiang-Lan |
| 9,612,958 | B1 | 4/2017 | Mehdi |
| 10,083,751 | B1 * | 9/2018 | Dallabora .......... G11C 13/0069 |
| 2005/0055495 | A1 | 3/2005 | Vihmalo et al. |
| 2008/0140918 | A1 | 6/2008 | Sutardja |
| 2008/0266942 | A1 | 10/2008 | Jeong et al. |
| 2009/0055575 | A1 | 2/2009 | Hanhimaki et al. |
| 2009/0296458 | A1 | 12/2009 | Lee et al. |
| 2010/0058018 | A1 | 3/2010 | Kund et al. |
| 2010/0169708 | A1 | 7/2010 | Rudelic et al. |
| 2011/0167197 | A1 | 7/2011 | Leinwander |
| 2012/0331204 | A1 | 12/2012 | Karpov et al. |
| 2013/0054871 | A1 | 2/2013 | Lassa |
| 2013/0219105 | A1 | 8/2013 | Confalonieri |
| 2015/0227459 | A1 | 8/2015 | Adachi et al. |
| 2015/0243353 | A1 | 8/2015 | Lee et al. |
| 2016/0284399 | A1 | 9/2016 | Mantegazza et al. |

OTHER PUBLICATIONS

Moinuddin, et al. "Enhancing Lifetime and Security of PCM-Based Main Memory with Start-Gap Wear Leveling" Proceedings of the 42nd Annual IEEE/ACM International Symposium on Microarchitecture, New York, NY, Dec. 2009, 10 pp.

Chul, et al. "A Hybrid Flash File System Based on NOR and NAND Flash Memories for Embedded Devices", In Proceedings of the 8th Annual IEEE Transactions on Computers, vol. 57, Issue 7, Jul. 2008, pp. 1002-1008.

Kim, et al. "A PRAM and NAND Flash Hybrid Architecture for High-Performance Embedded Storage Subsystems", In Proceedings of the 8th ACM International Conference on Embedded Software (EMSOFT 2008), ACM, New York, NY, Oct. 2008, pp. 31-39.

Awasthi, et al. "Handling PCM Resistance Drift with Device, Circuit, Architecture, and System Solutions", Non-Volatile Memory Worship, San Diego, Mar. 2011, 2 pp.

Taiwan Office Action from related Taiwanese Patent Application No. 107126261, dated Nov. 8, 2019, 6 pages.

* cited by examiner

DATA STATE SYNCHRONIZATION

PRIORITY INFORMATION

This application is a Continuation of U.S. application Ser. No. 15/664,014, filed Jul. 31, 2017, the specification of which is incorporated herein by reference.

TECHNICAL FIELD

The present disclosure relates generally to semiconductor memory and methods, and more particularly, to data state synchronization associated with memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), and magnetic random access memory (MRAM), among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), personal digital assistants (PDAs), digital cameras, cellular telephones, portable music players, for example, MP3 players, and movie players, among other electronic devices. Data, such as program code, user data, and/or system data, such as a basic input/output system (BIOS), are typically stored in non-volatile memory devices.

Resistance variable memory such as PCRAM includes resistance variable memory cells that can store data based on the resistance of a storage element (e.g., a storage element having a variable resistance). As such, resistance variable memory cells can be programmed to store data corresponding to a target state by varying the resistance level of the resistance variable storage element. Resistance variable memory cells can be programmed to a target state corresponding to a particular resistance, by applying sources of an electrical field or energy, such as positive or negative electrical signals (e.g., positive or negative voltage or current signals) to the cells.

One of a number of states (e.g., resistance states) can be set for a resistance variable memory cell. For example, a single level cell (SLC) may be programmed to one of two states (e.g., logic 1 or 0), which can depend on whether the cell is programmed to a resistance above or below a particular level. As an additional example, various resistance variable memory cells can be programmed to one of multiple different states corresponding to respective digit patterns (e.g., 10, 01, 00, 11, 111, 101, 100, 1010, 1111, 0101, 0001, etc.). Such cells may be referred to as multi state cells, multi-digit cells, and/or multilevel cells (MLCs).

The state of the resistance variable memory cell can be determined (e.g., read), for example, by sensing current through the cell responsive to an applied interrogation voltage. The sensed current, which varies based on the resistance of the cell, can indicate the state of the cell (e.g., the binary data stored by the cell). However, the resistance of a programmed resistance variable memory cell can drift (e.g., shift) over time. Resistance drift can result in erroneous sensing of a resistance variable memory cell (e.g., a determination that the cell is in a state other than that to which it was programmed), among other issues.

DETAILED DESCRIPTION

Figure 1:
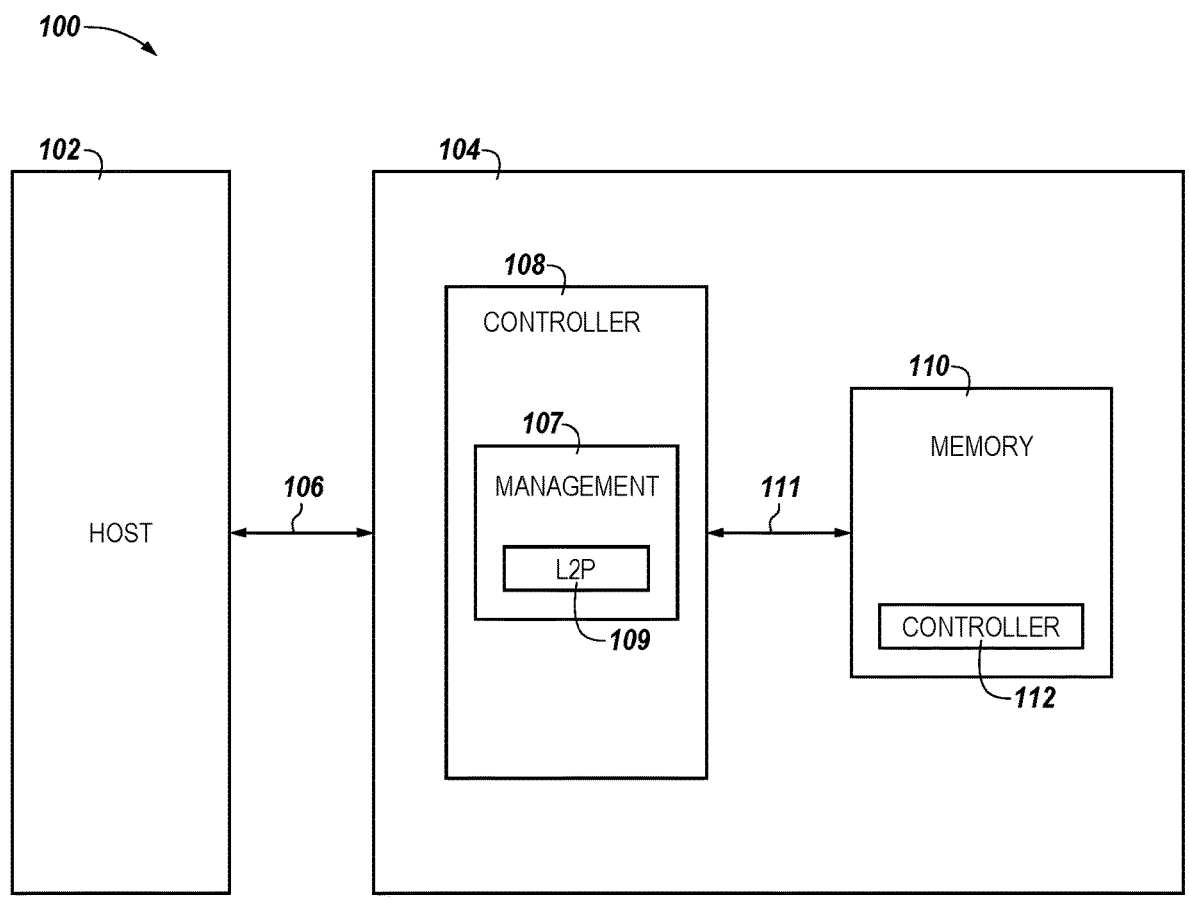
FIG. 1 is a block diagram of an apparatus in the form of a computing system including a memory system capable of providing data state synchronization in accordance with a number of embodiments of the present disclosure.

The present disclosure includes apparatuses, and methods for data state synchronization. An example apparatus includes performing a write operation to store a data pattern in a group of resistance variable memory cells corresponding to a selected managed unit having a first status, updating a status of the selected managed unit from the first status to a second status responsive to performing the write operation, and providing data state synchronization for a subsequent write operation performed on the group by placing all of the variable resistance memory cells of the group in a same state prior to performing the subsequent write operation to store another data pattern in the group of resistance variable memory cells.

Embodiments of the present disclosure can provide benefits such as reducing erroneous reading of resistance variable memory cells, whose resistance level can drift over time (e.g., after being programmed to a target state). Accordingly, embodiments can improve data reliability and/or data integrity as compared to previous approaches. For example, various previous approaches associated with correcting for resistance drift include tracking resistance drift (e.g., in the background in real time) and "refreshing" cells (e.g., setting the cells back to their target state) based on the amount of time the cells have been in a particular state (e.g. a drift time) and/or adjusting sensing threshold voltage levels to accommodate for the drift. Such an approach can require constantly maintaining information regarding drift time and/or can require a constant power supply, which may not be available for various applications such as mobile applications, for example. Another prior approach can involve always writing all cells of a particular group (e.g., a page of cells) such that all the cells are "set" or "reset" at the same time. Such an approach can be costly in terms of energy consumption by requiring programming of cells that may not require programming pulses, for instance. In contrast, a number of embodiments of the present disclosure can provide data state synchronization in a manner that reduces erroneous reads due to cell resistance drift, while reducing energy consumption as compared to prior approaches. Additionally, various embodiments can provide data state synchronization without tracking drift time, which can provide benefits such as not requiring a constant power supply (e.g., battery power), among other benefits.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "N" and "M", particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more" (e.g., a number of memory cells) can refer to one or more memory cells, whereas a "plurality of" is intended to refer to more than one of such things. Furthermore, the words "can" and "may" are used throughout this application in a permissive sense (e.g., having the potential to, being able to), not in a mandatory sense (e.g., required to).

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 510 in FIG. 5.

FIG. 1 is a block diagram of an apparatus in the form of a computing system 100 including a memory system 104 capable of providing data state synchronization in accordance with a number of embodiments of the present disclosure. As used herein, a memory system 104, a controller 108, or a memory device 110 might also be separately considered an "apparatus." The memory system 104 can be a solid state drive (SSD), for example, and can include a host interface 106, a controller 108 (e.g., a sequencer and/or other control circuitry), and a number of memory devices 110, which can serve as a memory for system 104 and can be referred to as memory 110.

The controller 108 can be coupled to the host 102 via host interface 106 and to the memory 110 via memory interface 111, and can be used to transfer data between the memory system 104 and a host 102. The host interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, the memory system 104 and the host 102 that are coupled to each other via the host interface 102 may each have a compatible receptor for passing control, address, data, and other signals via the host interface 106. Similarly, the controller 108 and the memory 110 may each have a receptor compatible with the memory interface 111. The interface 111 may support various standards and/or comply with various interface types (e.g., DDR, ONFI, NVMe, etc.).

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors). Host 102 can also be a memory controller, such as where memory system 104 is a memory device (e.g., a memory device having an on-die controller).

The controller 108 can communicate with the memory 110 (which in some embodiments can be a number of memory arrays on a single die) to control data read, write, and erase operations, among other operations. As an example, the controller 108 can be on a same die or a different die than a die or dice corresponding to memory 110.

As described above, the controller 108 can be coupled to the memory interface 111 coupling the controller 108 to the memory 110. The controller 108 can include, for example, a number of components in the form of hardware and/or firmware (e.g., one or more integrated circuits) and/or software for controlling access to the memory 110 and/or for facilitating data transfer between the host 102 and memory 110.

The controller 108 can include a management component 107. The management component 107 can provide and manage information (e.g., data) that can be used to locate data stored in the memory 110 and identify the frequency at which addresses (e.g., logical addresses) corresponding to data stored in the memory 110 has been accessed (e.g., during program operations). This information can be stored in a table 109 (e.g., logical to physical (L2P) address table). For example, the table 109 can include logical to physical address mappings and can indicate the frequency at which the physical addresses have been accessed during program operations. In a number of embodiments, the controller 108 is configured to select a group of memory cells (e.g., a page) independently of a particular logical address associated with a command (e.g., write command), and locate data associated with the write command in the memory 110 by updating and maintaining the logical to physical address table 107.

The memory 110 can include a number of memory arrays (not shown) and a memory controller 112. The memory controller 112 can be located internal to the memory 110, and can receive commands (e.g., write commands, read commands, refresh commands, etc.) from the controller 108 via the memory interface 111. As described further below, in a number of embodiments, the memory controller 112 can be configured to manage cell resistance drift by providing data state synchronization for memory 110 independently from the controller 108 and/or host 102 (e.g., without assistance from external controller 108 or host 102).

The memory array(s) of memory 110 can comprise, for example, non-volatile resistance variable memory cells each having an associated select element and a storage element. The select elements in each resistance variable memory cells can be operated (e.g., turned on/off) to select the memory cells in order to perform operations such as data programming and/or data reading operations on the resistance variable memory cells.

As used herein, a storage element refers to a programmable portion of a resistance variable memory cell. For example, in PCRAM and RRAM cells, a storage element can include the portion of the memory cell having a resistance that is programmable to data states responsive to applied programming signals (e.g., voltage and/or current pulses), for example. The storage element can include a resistance variable material such as a phase change material (e.g., phase change chalcogenide alloy) such as an indium (In)-antimony (Sb)-tellurium (Te) (IST) material, e.g., $In_2Sb_2Te_5$, $In_1Sb_2Te_4$, $In_1Sb_4Te_7$, etc., or a germanium-antimony-tellurium (GST) material, e.g., a Ge—Sb—Te material such as $Ge_2Sb_2Te_5$, $Ge_1Sb_2Te_4$, $Ge_1Sb_4Te_7$, etc. The hyphenated chemical composition notation, as used herein, indicates the elements included in a particular mixture or compound, and is intended to represent all stoichiometries involving the indicated elements. Other phase change materials can include GeTe, In—Se, $Sb_2Te_3$, GaSb, InSb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other phase change materials.

The select element can also be a chalcogenide material such as those described above. While the select element and the storage element can comprise different chalcogenide materials, embodiments are not so limited. For example, each cell can comprise a material (e.g., a chalcogenide material) that can serve as both the storage element and the select element (e.g., a switch and storage material (SSM)).

Resistance variable memory cells are rewritable as compared to floating gate cells of NAND memory array. For example, a particular data pattern can be programmed to a group of resistance variable memory cells without necessarily erasing data previously stored in the group.

Resistance memory cells can experience resistance drift (e.g., toward higher resistance) during a time between application of, for example, two operation signals (e.g., programming and/or reset signals). That is, the resistance level of the resistance variable memory cells can shift over time. Such resistance drift can be due to a spontaneous increase of the resistance of the resistance level of the cell after programming, for example, due to structural relaxation of an amorphous portion of the storage element (e.g., phase change material).

In operation, data can be written to and/or read from memory 110 as a page of data, for example. As such, a page of data can be referred to as a data transfer size of the memory system. Data can be sent to/from a host (e.g., host 102) in data segments referred to as sectors (e.g., host sectors). As such, a sector of data can be referred to as a data transfer size of the host. In a number of embodiments, the memory 110 can store managed units in respective groups (e.g., physical pages) of memory cells (e.g., resistance variable memory cells). Although embodiments are not so limited, a managed unit may correspond to a logical page size (e.g., e.g., a data transfer size of a host such as host 102) and/or a data management size of a memory system (e.g., system 104), which can be, for example 4 KB, 8K, etc. As an example, a managed unit can be mapped (e.g., via controller 108) to a physical page of memory cells. However, a number of managed units might be mapped to a physical page.

Figure 2A:
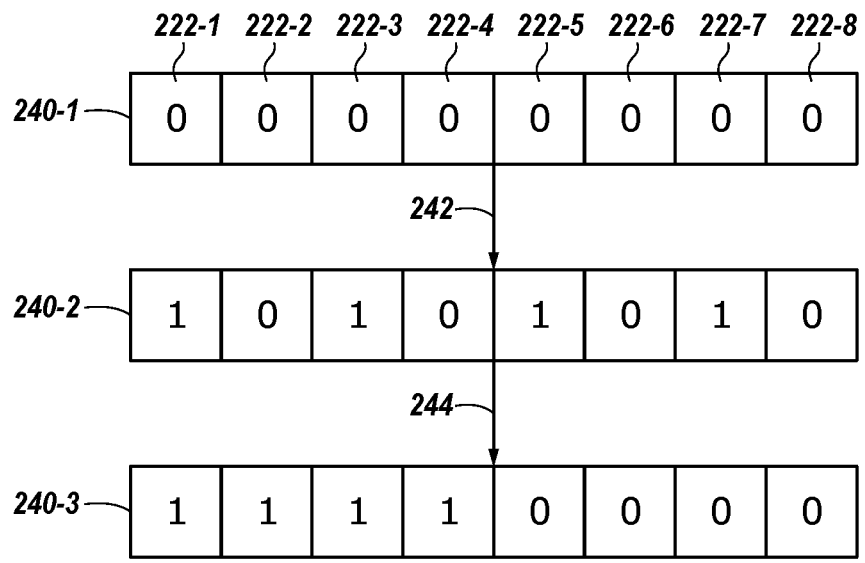
FIG. 2A-2B illustrates a group of resistance variable memory cells experiencing resistance drift.
Figure 2B:
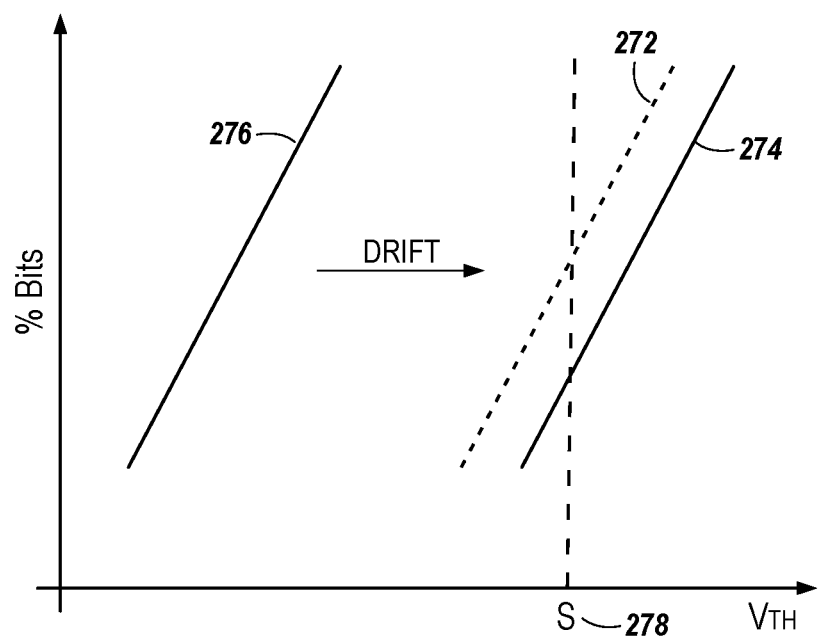

FIG. 2A-2B illustrates a group of resistance variable memory cells 222-1, 222-2, 222-3, 222-4, 224-5, 222-6, 222-7, and 222-8 (referred to collectively as cells 222) experiencing resistance drift. Although embodiments are not so limited, resistance distribution 274 corresponds to a reset state (e.g., a binary data value of "0"), and a resistance distribution 276 corresponds to a set state (e.g., binary data value of "1"). As shown in FIG. 2B, a reset state (e.g., distribution 274) corresponds to a higher resistance level than the set state (e.g., distribution 276). Resistance distribution 272 corresponds to cells programmed to distribution 276 but whose threshold voltage has drifted upward over time subsequent to being programmed.

In FIG. 2A, 240-1 represents a data pattern stored in the group of memory cells 222 (e.g., each of cells 222 are programmed to the reset state such that each cell is storing a binary value of "0"). Arrow 242 represents a write operation performed on the group and which results in a different data pattern 240-2 being stored in the group of cells 222. In this example, the write operation 242 involves programming cells 222-1, 222-3, 222-5, and 222-7 to the set state.

Arrow 244 represents a subsequent write operation performed on the group of memory cells 222 such that a different data pattern 240-3 is stored in the group of cells. As shown in FIG. 2A, the subsequent write operation 244 involves programming memory cells 222-5 and 222-7 from the set state (e.g., "1") back to the reset state (e.g., "0"). Write operation 244 also includes programming cells 222-2 and 222-4 from the reset state to the set state, while cells 222-1 and 222-3 remain in the set state and cells 222-6 and 222-8 remain in the reset state during the write operation 244.

Turning to FIG. 2B, during a time between the write operation 242 and the subsequent write operation 244 (e.g., referred to as a drift time), the group of memory cells 222 experience a resistance drift. Over the drift time, for example, resistance levels of those memory cells) programmed to the set state (e.g., distribution 276) during the write operation 242 (e.g., memory cells 222-1, 222-3, 222-5, and 222-7) are drifted to resistance distribution 272 (e.g., nearer to resistance distribution 274), while resistance levels of those memory cells programmed to the reset state (e.g., distribution 274) during the subsequent write operation 244 (e.g., cells 222-5 and 222-7) are returned to reset distribution 274. As result, the data pattern 240-3 (e.g., subsequent to write operation 244) includes cells belonging to resistance distribution 272 (e.g., cells 222-1 and 222-3) coexisting with cells belonging to resistance distribution 274 (e.g., cells 222-5 and 222-7). As such, a sensing voltage 278 used to read the group 222 (e.g., to distinguish between cells storing "0" and "1") may not be capable of accurately determining the states of cells belonging to the overlapping distributions 272 and 274, which may result in read errors.

Previous approaches to account for drift might involve always programming all of a page of cells (e.g., applying programming pulses to both those cells whose state is to be changed and those cells whose state is to remain the same), and/or tracking the drift time associated with the cells and adjusting the sensing threshold voltage (e.g., 278) as needed. However, such approaches may require a constant power source and/or can provide increased power consumption as compared to various embodiments of the present disclosure.

Other previous approaches are associated with keeping the gap between resistance levels of memory cells storing different data units. For example, those memory cells having a drifted resistance level above and/or below a certain threshold may be adjusted based on a tracked drift time.

However, this previous approach may not be applicable when absolute time information is not available such that a drift time is no longer being tracked. This can be particularly problematic when power supply (e.g., required to track the drift time) is often not available to, for example, a memory system (e.g., a smartphone or any other mobile system).

Embodiments of the present disclosure can provide benefits such as energy-efficiently reducing erroneous data read on resistance variable memory cells (e.g., caused by a resistance drift of the resistance variable memory cells) without tracking a drift time associated with programmed states of resistance variable memory cells. For example, embodiments can provide data state synchronization that eliminates of a risk having a drifted set state (e.g., a resistance distribution 272 drifted near to, or overlapping with, a resistance distribution 274) that is indistinguishable from a newly-programmed reset state (e.g., a resistance distribution 274) in the absence of information associated with the drift time.

Figure 3:
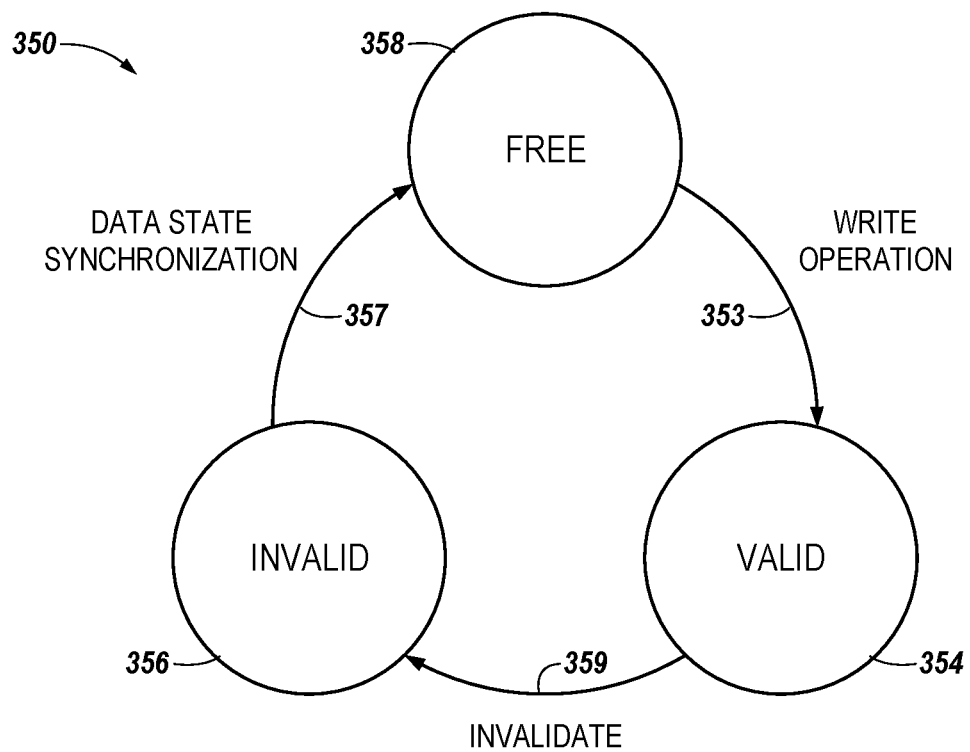
FIG. 3 illustrates a flow diagram associated with providing data state synchronization for a subsequent write operation in accordance with a number of embodiments of the present disclosure.

FIG. 3 illustrates a flow diagram 350 associated with providing data state synchronization in accordance with a number of embodiments of the present disclosure. As described in connection with FIG. 1, managed units can correspond to a particular data size and can be mapped to particular groups of memory cells (e.g., pages of resistance variable memory cells).

The flow diagram 350 illustrates an example of status transitions of managed units. The example shown in FIG. 3 illustrates a "free" status 358, a "valid" status 354, and an "invalid" status 356 of managed units. The status of managed units can be tracked, for example, by a controller such as controller 108 shown in FIG. 1. In a number of embodiments, the status transitions illustrated in flow diagram 350 may be experienced by managed units associated with a memory device (e.g., memory 110) comprising a resistance variable memory cells in association with providing data state synchronization in accordance with a number of embodiments of the present disclosure. The resistance variable memory cells can be programmable, for example, to one of two resistance states (e.g., a set state which may correspond to a logical "1" and a reset state which may correspond to a logical "0"). Although embodiments are not so limited, the reset state can correspond to a higher resistance level than the set state.

A free status 358 can refer to a managed unit that has experienced a "cleaning" operation and is ready to have a new data pattern programmed thereto. A cleaning operation can involve resetting of all of the memory cells of a corresponding managed unit (e.g., placing all of the cells in a "0" state). A valid status 354 can refer to a managed unit storing valid data (e.g., data currently in use by a system and having an up to date L2P mapping entry). An invalid status 356 can refer to a managed unit storing invalid data (e.g., data corresponding to a stale L2P mapping entry).

In FIG. 3, arrow 353 represents a status transition of a managed unit from a free status 358 to a valid status 354 responsive to a write operation to store a particular data pattern in a group of cells corresponding to a selected managed unit. Responsive to the write operation, the status of the selected managed unit, which is mapped by controller 108, is updated (e.g., from free to valid) to reflect that the selected managed unit now stores valid data. As an example, in response to a received write command (e.g., a write command received from host 102 to controller 108), a particular managed unit from among a number of managed units having free status can be selected to have host data (e.g., a data pattern received from a host) programmed thereto.

Arrow 359 represents a status transition of a managed unit from a valid status 354 to an invalid status 356 responsive to being invalidated (e.g., such that its corresponding mapping entry is no longer up to date). For example, the status of the managed unit can be updated from valid to invalid responsive to a trimming command received from the host, which can result in logical erasure (e.g., such that the data is not physically erased from the corresponding page of cells).

Arrow 357 represents a transition of a selected managed unit from an invalid status 356 to a free status 358 responsive to experiencing a cleaning operation in which the cells corresponding to the managed unit are all placed in a same state (e.g., reset state). The cleaning operation can provide data state synchronization for a subsequent write operation performed on the group of cells corresponding to the managed unit. For instance, by placing all of the variable resistance memory cells of the group in a same state (e.g., reset state) prior to executing a subsequent write command to store another (e.g., different) data pattern in the group, the method of FIG. 3 can reduce read errors by eliminating the occurrence of cell threshold voltage distribution overlap such as that described in FIGS. 2A and 2B. Updating of the status of a managed unit to the free status responsive to the cleaning operation can return the managed unit to a pool of managed units available for a next write operation. In a number of embodiments, the cleaning operation can be provided as a background operation to reduce latency associated with performing, for example, host commands on the group memory cells.

In a number of embodiments, a cleaning operation can include application of a reset signal only to those cells of the group not already in the reset state. As such, those cells that are not already in the reset state are programmed to the reset state at the same time (e.g., simultaneously). This synchronization prevents a drifted set state (e.g., a resistance distribution 272 corresponding to a set state that is drifted) from coexistence with a newly programmed reset state (e.g., a resistance distribution 274 corresponding to a reset state that is adjusted), which can cause an erroneous data read (e.g., by reducing a gap between those two states) as illustrated in connection with FIG. 2B.

Further, since memory cells that are already programmed to a reset state (e.g., prior to cleaning) need not be reprogrammed to the reset state, the cleaning operation can be performed in an energy efficient manner by preventing reset pulses from being applied to cells already in the reset state. Even though, memory cells having drifted reset states coexist with memory cells having newly programmed reset state, those distributions may not result in erroneous data reads since the controller (e.g., controller 108 and/or 112) knows that the memory cells are always placed in a reset state prior to being programmed to a different data pattern. As such, a drift adjustment need not be performed, and therefore, a drift time need not be tracked.

In a number of embodiments, providing data state synchronization in association with the flow diagram 350 can include determining whether the host data pattern includes a threshold quantity of data units (e.g., more than half) having a particular data value (e.g., a data value "0"), and, responsive to determining that the host data pattern includes at least the threshold quantity of data units having the particular data value, performing pattern inversion prior to storing the data pattern in the group of resistance variable memory cells. For example, performing the pattern inversion can include flipping the data units (e.g., bits) of the host data pattern such that all data units corresponding to a data value of "0" are flipped to a data value "1" and all data units) corresponding to a data value of "1" are flipped to a data value "0." Pattern inversion will be further described in connection with FIGS. 5 and 6.

Performing the pattern inversion can provide benefits such as reducing a quantity of cells of the group programmed to the lower resistance state (e.g., corresponding to a set state) as compared to a quantity of cells of the group that would be programmed to the lower resistance state (e.g., corresponding to a set state) in the absence of the pattern inversion. Performing the pattern inversion will be further described in connection with FIG. 5 and FIG. 6.

Figure 4:
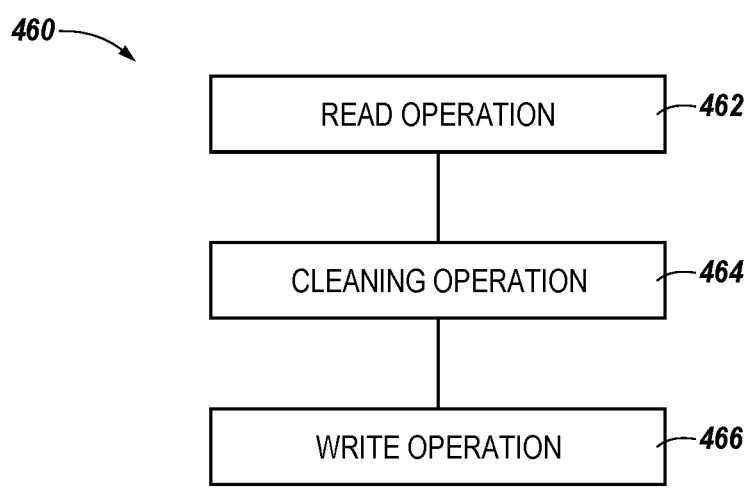
FIG. 4 illustrates a method for providing data state synchronization in accordance with a number of embodiments of the present disclosure.

FIG. 4 illustrates a method 460 for providing data state synchronization in accordance with a number of embodiments of the present disclosure. At 462, the method 460 can include performing a read operation on a selected group of resistance variable memory cells (e.g., a group corresponding to a managed unit) responsive to receiving a command to write a particular data pattern (e.g., a host data pattern) to a memory (e.g., memory 110). The read operation can be performed to determine current states of the selected cells and a data polarity corresponding to the selected group.

At 464, the method 460 includes performing a cleaning operation on the selected cells to place all of the selected cells in the reset state. For example, those of the selected cells currently programmed to the set state (e.g., prior to performing the cleaning operation) are programmed to the reset state simultaneously during the cleaning operation. As such, a reset time of those cells programmed to the reset state during the cleaning operation is synchronized during the operation.

Programming only those cells (e.g., previously programmed to the set state) of the selected cells to the reset state during the cleaning operation 466 provides benefits such as reducing a risk of erroneous data read on the selected cells without tracking a drift time associated with programmed states of the selected cells, as illustrated in connection with FIG. 3. At 466, the method 460 includes writing the particular data pattern to the selected cells. Writing the particular data pattern to the selected cells can include programming only those cells of the selected cells to be programmed to a set state.

In a number of embodiments, the method 460 can be performed without intervention by a controller external to a memory. For example, the method 460 can be performed by controller 112 shown in FIG. 1 (e.g., without intervention by an external controller such as controller 108 and/or host 102). For instance, unlike the method described in FIG. 3, in which an external controller assists with drift management by tracking and updating statuses of managed units, the method 460 is implemented by an internal controller such as controller 112. Performing data state synchronization in accordance with the method 460 can further reduce latency associated with tracking statuses of, for example, respective managed units of the memory.

In a number of embodiments, a particular data pattern (e.g., host data pattern) to be stored in the memory can be inverted prior to being written to the memory (e.g., in inverse form). As described in connection with FIG. 3, the pattern inversion can be performed on the particular data pattern to reduce a quantity of cells of the group programmed to the lower resistance state as compared to a quantity of cells of the group that would be programmed to the lower resistance state in the absence of the pattern inversion. The pattern inversion will be further described in connection with FIGS. 5 and 6.

Figure 5:
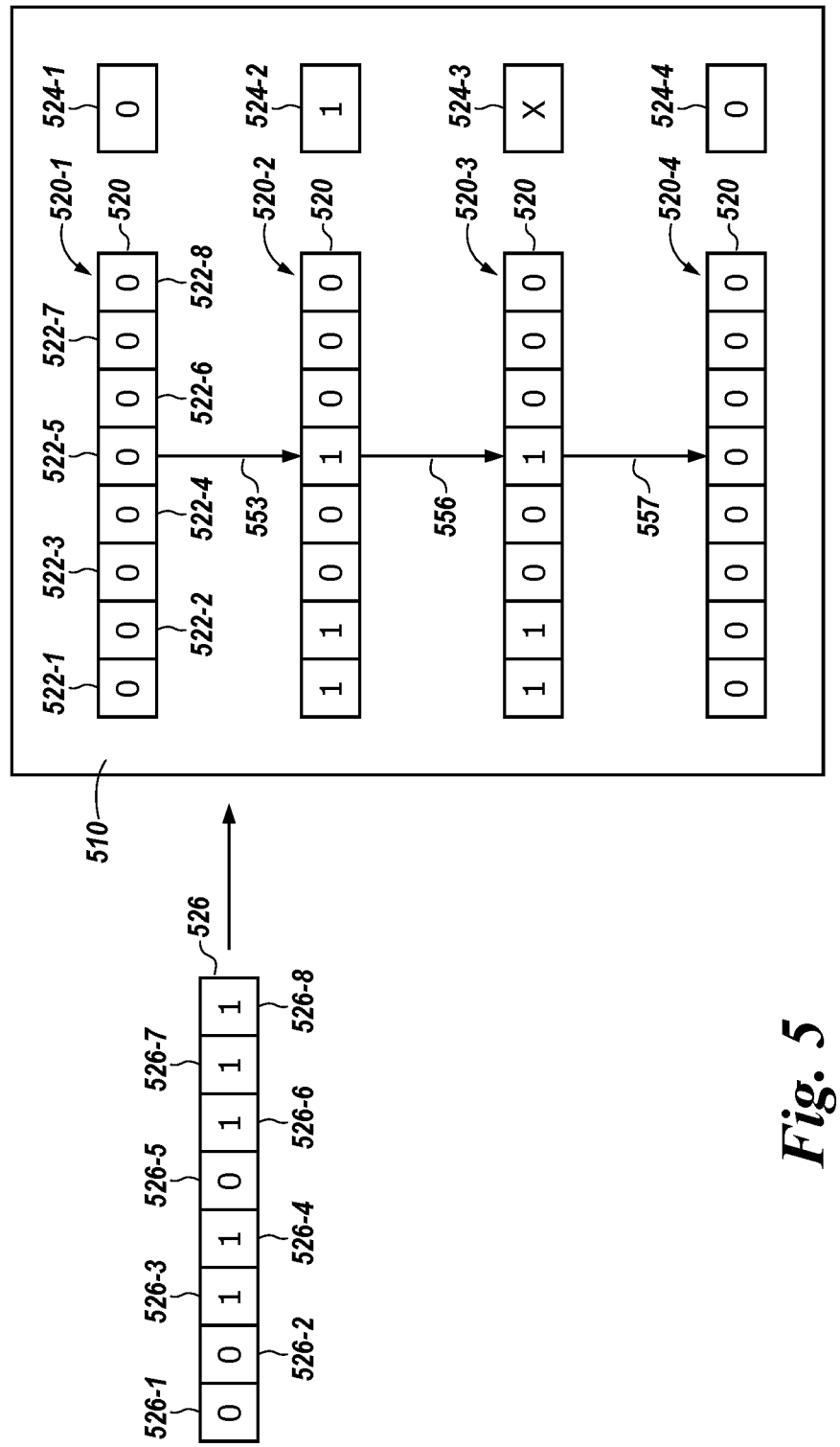
FIG. 5 illustrates a status of a managed unit associated with providing data state synchronization in accordance with a number of embodiments of the present disclosure.

FIG. 5 illustrates a status of a managed unit 520 associated with providing data state synchronization in accordance with a number of embodiments of the present disclosure. In this example, the memory 510 comprises a plurality of managed units corresponding to respective groups of resistance variable memory cells that are programmable to a reset state and a set state, although only one managed unit (e.g., managed unit 520) is shown in FIG. 5. As illustrated in connection with FIG. 3, the reset state can correspond to a binary data value of "0," and have a higher resistance level than that of the set state. Similarly, the set state can correspond to a binary data value of "1," although embodiments are not so limited.

As shown in FIG. 5, a memory system (e.g., memory system 104) comprising the memory 510 receives a host data pattern 526 from a host (e.g., host 102), and writes the host data pattern 526 in accordance with a number of embodiments of the present disclosure. Prior to being programmed to store the host data pattern 526, a managed unit 520 is in a free status (e.g., as shown at 520-1), in which all resistance variable memory cells 522-1, . . . , 522-8 are in a same state (e.g., reset state). In a number of embodiments, a managed unit may comprise a flag (e.g., 524-1, . . . , 524-4) that indicates whether a data pattern stored in the managed unit is inverted or not. Prior to being programmed to the host data pattern 526, the flag 524-1 may also be in a reset state (e.g., having a binary data value of "0"). The flag may be a particular bit in the managed unit, although embodiments are not so limited.

Responsive to receiving a write command associated with host data pattern 526, a controller (e.g., controller 108) is configured to perform pattern inversion prior to storing the data pattern to the managed unit responsive to determining that the host data pattern 526 includes at least a threshold quantity of data units (e.g., more than half) having a particular data value. For example, as shown in FIG. 5, the host data pattern 526 comprises five data units 526-3, 526-4, 526-6, 526-7, and 526-8 having a binary data value of "1." When the threshold quantity is determined (e.g., predetermined) to be 50% such that the host data pattern 526 meets the threshold quantity (five data units out of eight data units have a binary data value of "1"), the pattern inversion is performed on the host data pattern 526. In this example, the pattern inversion performed on the host data pattern 526 (e.g., having a binary data pattern of "00110111") results in an inverted host data pattern (e.g., having a binary data pattern of "11001000).

Subsequent to performing the pattern inversion, the controller is configured to perform a write operation 553 to store the inverted host data pattern 526 to the managed unit 520, set a flag indicating that the managed unit 520 stores an inverted host data pattern, and update a status of the managed unit 520 from a free status to a valid status. As a result, the managed unit 520 at 520-2 (e.g., illustrating a status of the managed unit 520 subsequent to being programmed to the inverted host data pattern) includes resistance variable memory cells 524-1, . . . , 524-8 programmed to a binary data pattern "11001000," and a flag 524-2 set to a binary data value of "1" (e.g., indicating that the data pattern stored in the managed unit 520 at 520-2 is inverted).

Performing the pattern inversion provides benefits such as reducing energy consumption associated with flipping bits stored in memory cells having a binary value of "1." Consider the host data pattern 526 comprising five data units having a binary data value of "1." In this example, when the host data pattern 526 is written to the managed unit 520 without being inverted, a controller (e.g., controller 108) is required to flip five bits (e.g., stored in respective memory cells of the managed unit 520) during a cleaning operation. In contrast, the controller is merely required to flip three bits (e.g., stored in respective memory cells of the managed units 520) during the cleaning operation when the inverse of the host data pattern (e.g., including only three data units having a binary data value of "1") is written to the managed unit 520. As such, performing the pattern inversion reduces a quantity of cells of the managed unit programmed to the set state as compared to a quantity of cells of the managed unit that would be programmed to the set state in the absence of pattern inversion, which reduces latency associated with flipping bits (e.g., having a binary value of "1") stored in respective cells of the managed unit (e.g., managed unit 520).

At some point (e.g., 556), the controller is configured to invalidate (e.g., updating a status to an invalid status) the managed unit 520 such that the data pattern stored in the managed unit 520 at 520-2 is logically erased. As a result, the data pattern stored in the managed unit 520 at 520-3 (e.g., illustrating the managed unit 520 subsequent to being invalidated) is no longer tracked by, for example, a host (e.g., host 102), while physical remaining in the managed unit 520 at 520-3. The flag 524-3 is also invalidated responsive to the managed unit 520 being invalidated.

Responsive to determining that the managed unit 520 at 520-3 is in the invalid status, the controller 108 is configured to provide data state synchronization by performing a cleaning operation 557 that places, for example, only those resistance variable memory cells in a set state to a reset state. In this example, the cleaning operation 557 places the memory cells 522-1, 522-2, and 522-5 in a reset state such that all of the resistance variable memory cells 522-1, . . . , 522-8 are placed in a reset state. As a result, the managed unit 520 at 520-4 (e.g., illustrating a status of the managed unit 520 subsequent to performing the cleaning operation 557) includes a binary data pattern of "0000000." Similarly, the flag 524 is set to a reset state (e.g., as shown by a flag 524-4). As such, a subsequent write operation can be performed on the managed unit 520, in which all of the resistance variable memory cells that were previously set to a set state have a synchronized reset time (e.g., a time at which memory cells are placed in a reset state).

In a number of embodiments, the cleaning operation 557 can be performed in the background. For example, subsequent to invalidating a plurality of managed unit including the managed unit 520 (e.g., as shown by managed unit 520 at 520-3), the controller can be configured to perform the cleaning operation 557 on those managed units determined to having an invalid status during idle time (e.g., when the controller 108 is not executing host commands). Performing the cleaning operation as a background operation can provide benefits such as preventing such operations from negatively affecting latency, among others.

In a number of embodiments, the data state synchronization can be implemented via a controller (e.g., controller 108) that is located external to the memory 110. In this example, the controller is able to track respective statuses of a plurality of managed units of the memory 510, for example, via a logical to physical address table (e.g., logical to physical address table 109). As such, the controller (e.g., that can utilize information provided by the logical to physical address table) can be configured to maintain a pointer to a physical address corresponding to a particular one of a plurality of managed units (e.g., managed unit 520) designated for a subsequent write command and having a free status, and update the status of the particular managed unit to an invalid status subsequent to performing the write command (e.g., such that a subsequent write command is not performed on the same managed unit). Subsequently, the controller can be configured to further update the pointer to a next available managed unit (e.g., that is in a free status) such that each managed unit is prevented from being exceedingly overwritten, which can potentially reduce the reliability and/or useful life of the cell.

Figure 6:
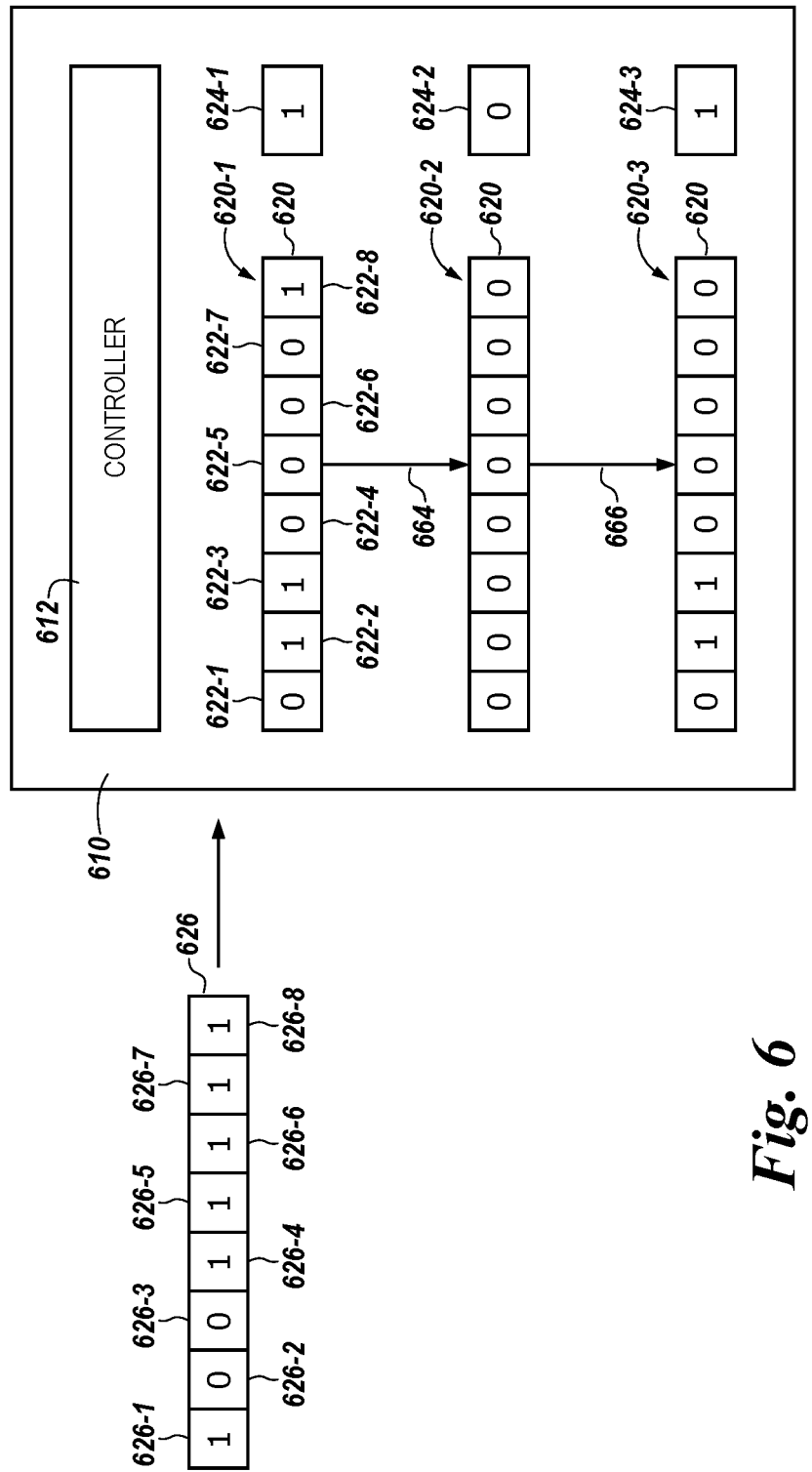
FIG. 6 illustrates a status of a managed unit associated with providing data state synchronization in accordance with a number of embodiments of the present disclosure.

FIG. 6 illustrates a status of a managed unit 620 associated with providing data state synchronization in accordance with a number of embodiments of the present disclosure. In this example, the memory 610 comprises a plurality of managed units including a managed unit 620 corresponding to a group of resistance variable memory cells 622-1, . . . , 622-8 that are programmable to a reset state and a set state. As illustrated in connection with FIG. 2, the reset state can correspond to a binary data value of "0," and have a higher resistance level than that of the set state. Similarly, the set state can correspond to a binary data value of "1," although embodiments are not so limited. Although only one managed unit is illustrated in FIG. 6, the memory 610 can include a plurality of managed units corresponding to respective groups of resistance variable memory cells.

As shown in FIG. 6, the memory 610 receives a command to write a host data pattern 626 having a binary data pattern of "10011111." Responsive to receiving the command, a controller 612 (e.g., memory controller 112) that is located internal to the memory 610 can be configured to perform a read operation (not shown in FIG. 6) on the managed unit 620 to determine current states of resistance variable memory cells 622-1, . . . , 622-8 and a data polarity corresponding to the memory cells 622-1 . . . , 622-8. As a result of the read operation, the controller 612 determines that the resistance variable memory cells includes a binary data pattern of "01100001" (e.g., as shown in a managed unit 620 at 620-1), and the data pattern stored in the managed unit 620 is inverted (e.g., since an inversion flag 624 having a binary data value of "1" indicates that the data pattern stored in the managed unit 620 is an inverted data pattern).

Subsequent to performing the read operation, the controller 612 is configured to perform a cleaning operation 664 on the managed unit 620 to place all of the resistance variable memory cells 622-1, . . . , 622-8 in a reset state. As such, the managed unit 620 at 620-2 (e.g., illustrating a status of the managed unit 620 subsequent to performing the cleaning operation 664) includes the cells each having a binary data value of "0." In a number of embodiments, performing the cleaning operation 664 can include applying a cleaning signal (e.g., reset signal) to only those memory cells (e.g., memory cells 622-2, 622-3, and 622-8) determined to be currently (e.g., at 620-1) programmed to a set state. Performing data state synchronization via the controller (e.g., controller 612) located internal to the memory 610 provides benefits such as reducing latency associated with tracking and/or updating statuses of respective managed units as compared to performing the same via the controller (e.g., controller 108) located external to the memory 610 and utilizing information provided from a logical to physical address table (e.g., table 107).

Subsequent to performing the cleaning operation 664, the controller 612 can be configured to write (e.g., performing a write operation) one of the host data pattern 626 and an inverse of the host data pattern 626 to the managed unit 626 based on a characteristic of the host data pattern. As described in connection with FIG. 5, the controller 612 can be configured to write the inverse of the host data pattern 626 responsive to determining that the host data pattern 626 includes at least a threshold quantity (e.g., 50%) of data units having, for example, a binary data value of "1." In this example, the host data pattern 626 includes six (e.g., out of ten) data units 626-1, 626-4, 626-5, 626-6, 626-7, and 626-8 having a binary data value of "1." As such, the controller 612 writes the inverse of the host data pattern (e.g., host data pattern 626) to the managed unit 620 such that the managed unit 620 at 620-3 (e.g., illustrating a status of the managed unit 620 subsequent to being programmed) includes a data pattern (e.g., a binary data pattern "01100000) corresponding to the inverse of the host data pattern (e.g., host data pattern 626).

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   updating a status of a managed unit having a first status to a second status responsive to performing a write operation on a group of resistance variable memory cells corresponding to the managed unit;
   updating the status of the managed unit from the second status to a third status subsequent to updating the status of the managed unit to the second status; and
   providing data state synchronization for a subsequent write operation performed on the group by updating the status of the managed unit from the third status to the first status prior to performing the subsequent write operation.

2. The method of claim 1, wherein:
   the first status is a free status indicating unwritten managed units that are available for receiving data;
   the second status is a valid status indicating written managed units corresponding to valid logical to physical mappings; and
   the third status is an invalid status indicating written managed units corresponding to invalid logical to physical mappings.

3. The method of claim 1, wherein the first status corresponds to a higher resistance level than the second status.

4. The method of claim 1, wherein updating the status of the managed unit from the third status to the first status comprises applying a reset signal only to those cells of the group not already in the first status.

5. The method of claim 1, wherein the managed unit is one of a plurality of managed units, and the method further comprises tracking respective statuses of the plurality of managed units.

6. The method of claim 1, wherein performing the write operation includes writing one of a particular data pattern received from a host and an inverse of the particular data pattern to the group of resistance variable memory cells.

7. A system, comprising:
   a host; and
   a controller coupled to a memory and configured to:
      receive, from the host, a write command having a data pattern to be written to a group of resistance variable memory cells corresponding to a managed unit;
      responsive to determining that the data pattern includes at least a threshold quantity of data units having a particular data value, perform a pattern inversion to result in an inverse of the data pattern;
      perform a write operation to store the inverse of the data pattern on the managed unit; and
      provide data state synchronization for a subsequent write operation performed on the group by placing the variable resistance memory cells of the group in a same state prior to performing a subsequent write operation to store another data pattern in the managed unit.

8. The system of claim 7, wherein the controller is configured to select a particular managed unit among a plurality of managed units having a free status indicating unwritten managed units that are available for receiving data such that a particular write command received from the host is executed on the selected managed unit having the free status.

9. The system of claim 7, wherein:
   the particular data value corresponds to a lower resistance state than a resistance state corresponding to a different data value; and
   the pattern inversion performed on the data pattern reduces a quantity of cells of the group programmed to the lower resistance state as compared to a quantity of cells of the group that would be programmed to the lower resistance state in the absence of the pattern inversion.

10. The system of claim 7, wherein the controller is external to the memory and coupled to the host via a host interface such that the write command is received via the host interface.

11. The system of claim 7, wherein the resistance variable memory cells comprises at least one of:
   a storage element comprising a first chalcogenide material and select element comprising a second chalcogenide material; and
   a chalcogenide material serving as both a storage element and a select element.

12. An apparatus, comprising:
   a memory comprising a plurality of managed units corresponding to respective groups of resistance variable memory cells;
   a controller configured to:
      place, to provide data state synchronization for a write operation performed on a group of resistance variable memory cells corresponding to a selected one of the plurality of managed units, all of the resistance memory cells of the group in a same state, wherein the data state synchronization is achieved without tracking a drift time associated with programmed states of the resistance variable memory cells; and perform, subsequent to the data state synchronization is achieved, the write operation associated with a particular data pattern on the selected managed unit.

13. The apparatus of claim 12, wherein the group of resistance variable memory cells are programmable to one of a first state and a second state, and wherein the same state is the first state.

14. The apparatus of claim 13, wherein the controller being configured to place the variable resistance memory cells of the group in the same state comprises the controller being configured to:

perform a read operation on the group of resistance variable memory cells;

determine those cells of the group currently programmed to the second state; and perform a clean operation by applying a cleaning signal only to those cells of the group determined to be programmed to the second state.

15. The apparatus of claim 14, wherein the controller is a memory controller internal to the memory, and wherein the write command is received from a controller external to the memory via a memory interface.

16. The apparatus of claim 15, wherein the memory controller is configured to provide the data state synchronization independently from the controller external to the memory.

17. The apparatus of claim 12, wherein the controller being configured to perform the write operation on the group of resistance variable memory cells comprises the controller being configured to apply a programming signal to only those cells being programmed to the second state.

18. The apparatus of claim 12, wherein the controller being configured to perform, subsequent to the data state synchronization is achieved, the write operation associated with the particular data pattern on the selected managed unit comprises the controller being configured to write one of the particular data pattern and an inverse of the particular data pattern to the resistance variable memory cells of the group.

19. The apparatus of claim 18, wherein the selected managed unit comprises a cell indicating whether a data pattern stored in the managed unit is a host data pattern or an inverse of the host data pattern.

20. The apparatus of claim 12, wherein the controller is configured to track respective statuses of the plurality of manages units.

* * * * *